(12) United States Patent
Nam et al.

(10) Patent No.: US 8,298,910 B2
(45) Date of Patent: Oct. 30, 2012

(54) METHOD OF FABRICATING SEMICONDUCTOR DEVICE

(75) Inventors: Sang-Don Nam, Seoul (KR);
Sang-Hoon Ahn, Hwaseong-si (KR);
Eunkee Hong, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 396 days.

(21) Appl. No.: 12/732,907

(22) Filed: Mar. 26, 2010

(65) Prior Publication Data
US 2010/0248471 A1 Sep. 30, 2010

(30) Foreign Application Priority Data
Mar. 26, 2009 (KR) .................. 10-2009-0025990

(51) Int. Cl.
*H01L 21/764* (2006.01)
(52) U.S. Cl. ..................... 438/421; 438/422
(58) Field of Classification Search .......... None
See application file for complete search history.

(56) References Cited

U.S. PATENT DOCUMENTS
6,780,753 B2 8/2004 Latchford et al.
2011/0062453 A1* 3/2011 Armitage ................. 257/79

FOREIGN PATENT DOCUMENTS
KR 1020060005182 A 1/2006
KR 100843233 B1 6/2008

\* cited by examiner

*Primary Examiner* — Zandra Smith
*Assistant Examiner* — Pamela E Perkins
(74) *Attorney, Agent, or Firm* — Myers Bigel Sibley & Sajovec, P.A.

(57) ABSTRACT

Provided is a method for fabricating a semiconductor device, including forming an interconnect structure including first and second interconnects and an insulating material between the first and second interconnects, forming a first mask layer and a second mask layer having a plurality of micropores sequentially on the interconnect structure, coalescing the plurality of micropores in the second mask layer with each other and forming a plurality of first microholes in the second mask layer, forming a plurality of second microholes in the first mask layer using the plurality of first microholes, and removing the insulating material using the first mask layer with the plurality of second microholes as an etch mask so as to form an air-gap between the first and second interconnects.

10 Claims, 7 Drawing Sheets

METHOD OF FABRICATING SEMICONDUCTOR DEVICE

CROSS-REFERENCE TO RELATED APPLICATION

This application claims priority under 35 USC §119 to Korean Patent Application No. 10-2009-0025990 filed on Mar. 26, 2009, in the Korean Intellectual Property Office (KIPO), the contents of which are incorporated herein in by reference in their entirety.

BACKGROUND

1. Field of the Invention

The present inventive subject matter relates to methods of fabricating a semiconductor device, and, more particularly, to methods of fabricating a semiconductor device in which an air-gap is formed between interconnects.

2. Description of the Related Art

With chip sizes decreasing to nanoscale, resistance-capacitance (RC) delay of interconnects within a semiconductor device and power consumption have increased.

To solve the above problems associated with interconnects of a semiconductor device, a conventional approach has been to develop low-resistance copper (Cu) interconnects and low-k dielectrics. However, this method may be limited when developing low-k dielectric having a dielectric constant (k) less than 2.5. A proposed alternative has been to form an air-gap between Cu interconnects.

According to some conventional methods, an air-gap structure may be formed using non-conformal deposition, a thermal decomposable polymer, or a di-block copolymer. However, the conventional methods may have drawbacks in that an air-gap is not easy to form at a desired region at a desired level and the shape of the air-gap cannot be easily adjusted, thereby causing defects in a semiconductor device.

Another drawback is that an air-gap generally cannot be selectively formed between interconnects, thereby degrading the mechanical strength of a semiconductor device. Still another drawback is that a separate new material may be needed to form an air-gap.

SUMMARY

The present inventive subject matter provides a method of fabricating a semiconductor device in which an air-gap is formed between interconnects.

According to an aspect of the present inventive subject matter, there is provided a method for fabricating a semiconductor device, the method including forming an interconnect structure including first and second interconnects and an insulating material between the first and second interconnects, forming a first mask layer and a second mask layer having a plurality of micropores sequentially on the interconnect structure, coalescing the plurality of micropores in the second mask layer with each other and forming a plurality of first microholes in the second mask layer, forming a plurality of second microholes in the first mask layer using the plurality of first microholes, and removing the insulating material using the first mask layer with the plurality of second microholes as an etch mask so as to form an air-gap between the first and second interconnects.

BRIEF DESCRIPTION OF THE DRAWINGS

The above and other features and advantages of the present inventive subject matter will become more apparent by describing in detail embodiments thereof with reference to the attached drawings in which.

DETAILED DESCRIPTION OF THE EMBODIMENTS

Figure 1:
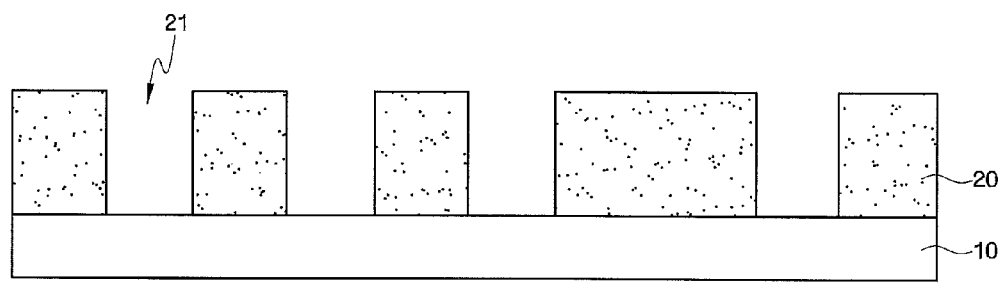
FIGS. 1 through 11 are cross-sectional views illustrating a process sequence of a method of fabricating a semiconductor device according to an embodiment of the present inventive subject matter.

Advantages and features of the present invention and methods of accomplishing the same may be understood more readily by reference to the following detailed description of preferred embodiments and the accompanying drawings. The present inventive subject matter may, however, be embodied in many different forms and should not be construed as being limited to the embodiments set forth herein. Rather, these embodiments are provided so that this disclosure will be thorough and complete and will fully convey the concept of the inventive subject matter to those skilled in the art, and the present inventive subject matter will only be defined by the appended claims. In some embodiments, well known methods, procedures, components, and circuits have not been described in detail so as not to unnecessarily obscure aspects of the present inventive subject matter.

It will be understood that when an element or layer is referred to as being "on", "connected to" or "coupled to" another element, it can be directly on, connected or coupled to the other element or layer or intervening elements may be present. In contrast, when an element is referred to as being "directly on," "directly connected to" or "directly coupled to" another element, there are no intervening elements present. Like numbers refer to like elements throughout the description. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries and this specification, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, a method of fabricating a semiconductor device according to an embodiment of the present inventive subject matter will now be described with reference to FIGS. 1 through 11.

FIGS. 1 through 11 are cross-sectional views illustrating a process sequence of a method of fabricating a semiconductor device according to an embodiment of the present inventive subject matter.

Referring to FIG. 1, an insulating layer 20 is formed on a substrate 10 followed by typical etching of predetermined portion of the insulating layer 20 to expose the substrate 10 and form holes 21 for metal interconnects. The insulating layer 20 may be an Inter Metal Dielectric (IMD) layer or Inter Layer Dielectric (ILD) layer.

The insulating layer 20 may be a silicon oxide (SiOx) layer, a plasma enhanced tetraethylorthosilicate (PE-TEOS) layer, a plasma enhanced oxide (PEOX) layer, a fluoride silicate glass (FSG) layer, a phosphosilicate glass (PSG) layer, a borophosphosilicate glass (BPSG) layer, an undoped silicate glass (USG) layer, and/or a stacked layer thereof. Here, the insulating layer 20 may be formed to a thickness of approximately 5000-2000 Å using, for example, chemical vapor deposition (CVD). However, the thickness of the insulating layer 20 is not limited to the range stated above.

Figure 2:
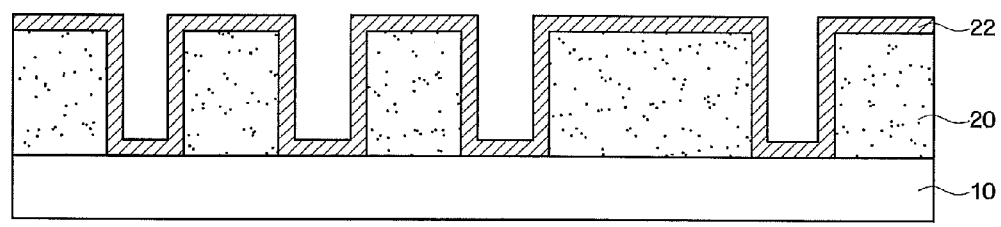

Next, referring to FIG. 2, a diffusion barrier layer 22 is conformably formed on sidewalls and bottoms of the holes 21.

The diffusion barrier layer 22 suppresses diffusion of a metal interconnect material to fill up the holes 21. For example, if a metal interconnect is formed using Cu damascene, Cu has a large diffusion coefficient with respect to silicon dioxide ($SiO_2$) used for the insulating layer 20. As a result, if Cu diffuses into the insulating layer 20 formed of $SiO_2$, the insulating layer 20 becomes conductive, which may degrade the insulating properties. Thus, the diffusion barrier layer 22 is formed so as to prevent a metal interconnect material that will be inserted into the holes 21 from diffusing into the insulating layer 20.

The diffusion barrier layer 22 may be formed of a material that will not react with metal or a high fusion point metal. In particular, if a metal interconnect is made of Cu, the diffusion barrier layer 22 may be formed of a material that will not react with Cu or Cu alloy. For example, the diffusion barrier layer 22 may be formed of a layer made of a material selected from Ti, Ta, W, Ru, TiN, TaN, WN, TiZrN, TiSiN, TaAlN, TaSiN, $TaSi_2$, TiW, and/or combinations of these elements, and/or a stacked layer thereof. Here, the diffusion barrier layer 22 may be formed to a thickness of 10 to 1000 Å, but aspects of the present inventive subject matter are not limited thereto. The diffusion barrier layer 22 may be formed by at least one technique selected from PVD, ALD, and/or CVD.

Figure 3:
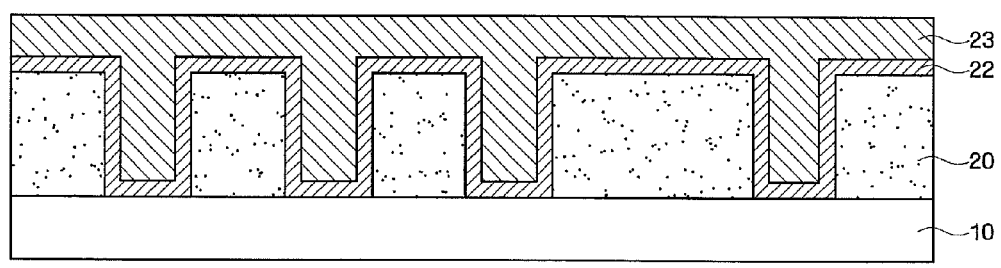

Referring to FIG. 3, an interconnect material is then formed over the diffusion barrier layer 22 to form the metal layer 23. In this case, the interconnect material is buried into the holes 21. Copper (Cu), aluminum (Al), Cu alloy, and/or Al alloy/may be used as the interconnect material.

Figure 4:
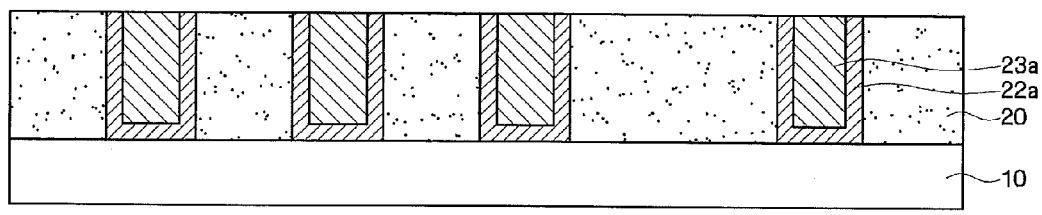

Referring to FIGS. 3 and 4, the metal layer 23 is subsequently planarized. Together with the metal layer 23, the diffusion barrier layer 22 is planarized to expose the top surface of the underlying insulating layer 20 by performing Chemical Mechanical Planarization (CMP) and/or an etchback process.

By performing the planarization, a diffusion barrier pattern 22a and a damascene interconnect 23a are formed in the hole 21. That is, an interconnect structure having the diffusion barrier pattern 22a and the damascene interconnect 23a is formed. In this case, a plurality of interconnects 23a may be formed in the insulating layer 20 as needed, with an insulating material therebetween.

Although the interconnect structure according to the current embodiment has been described to have the damascene interconnect 23a, aspects of the present inventive subject matter are not limited thereto. That is, the interconnect structure may include an interconnect having other various structures.

Figure 5:
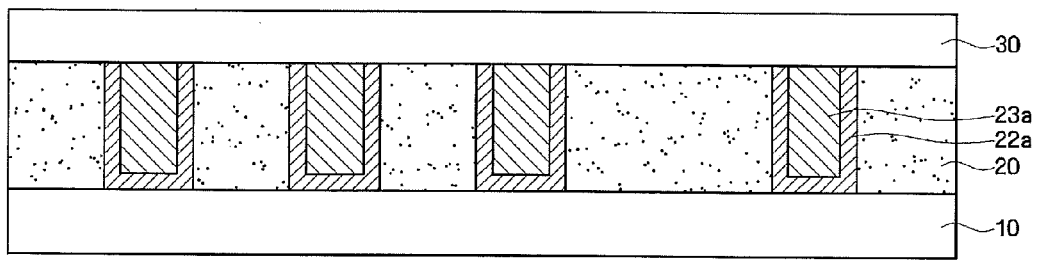

Next, referring to FIG. 5, a first mask layer 30 is formed over the interconnect structure. Because the first mask layer 30 acts as a hard mask for forming an air-gap (25 in FIG. 11) during a subsequent step, it is formed of a material having an etch selectivity different from that of the insulating material of the interconnect structure. In this embodiment, the first mask layer 30 may be formed of amorphous carbon containing hydrogen incorporated as silanol (SiOH) or amorphous carbon hydrogen (a-C:H).

The first mask layer 30 may be formed by chemical vapor deposition (CVD). The mask layer 30 may be formed to a thickness greater than 50 nm so as to serve as an etch mask for forming an air-gap during a subsequent step. More specifically, the mask layer 30 is sufficiently thick to function as a mask because the first mask layer 30 will be partially etched during an etch process for forming the air-gap.

Figure 6:
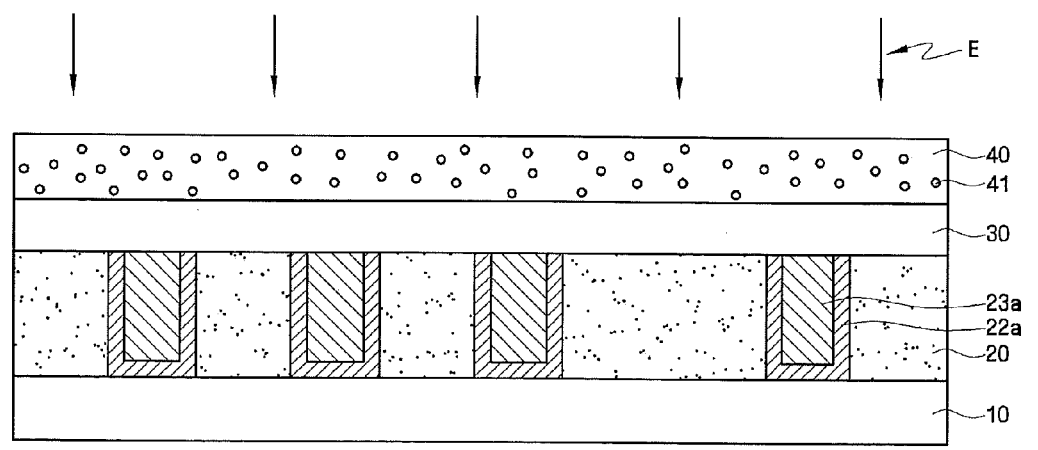

Referring to FIG. 6, a second mask layer 40 is then formed over the first mask layer 30 using a material having a dielectric constant (k) of about 1.8 to 2.5.

In this case, the second mask layer 40 has a plurality of micropores 41 thereon.

The second mask layer 40 is used as an etch mask for forming a plurality of second microholes (32 in FIG. 9) in the first mask layer 30. Thus, the second mask layer 40 possesses a sufficient mechanical strength to serve as an etch mask that can sustain an etch process for forming the plurality of second microholes 32.

A material with a dielectric constant less than 1.8 may have a larger number of micropores 41, which may result in a weaker mechanical strength than a material with a dielectric constant greater than 1.8. Thus, if the second mask layer 40 is made of a material having a dielectric constant less than 1.8, it may not possess a sufficient mechanical strength to function as an etch mask.

On the other hand, a material with a dielectric constant greater than 2.5 may have greater mechanical strength but a smaller number of micropores 41 than a material with a dielectric constant between about 1.8 and 2.5. In this case, a smaller number of first microholes (42 in FIG. 7) are formed in a subsequent step, which may make it more difficult to form an air-gap. Therefore, the second mask layer 40 may be formed of a material with a dielectric constant between about 1.8 and 2.5.

In other embodiments, in consideration of the mechanical strength and the number of the first microholes 42 to be produced, the second mask layer 40 may be formed of a material with a dielectric constant between about 2.2 and 2.4.

Further, the second mask layer 40 may be formed of a material with a dielectric constant of about 1.8 to 2.5 and a porosity of about 25% to 60%.

If the porosity is less than 25%, the second mask layer 40 has a small number of the micropores 41 formed therein. Thus, because a small number of the first microholes 42 are formed by performing heat treatment on the micropores 41, it may be difficult to form an air-gap. On the other hand, if the porosity exceeds 60%, the second mask layer 40 may suffer from poor mechanical strength so it may not be used as a mask in the etching process.

The second mask layer 40 may be formed of a Si—O—C—H based material that is a porous material having the plurality of micropores 41.

Figure 7:
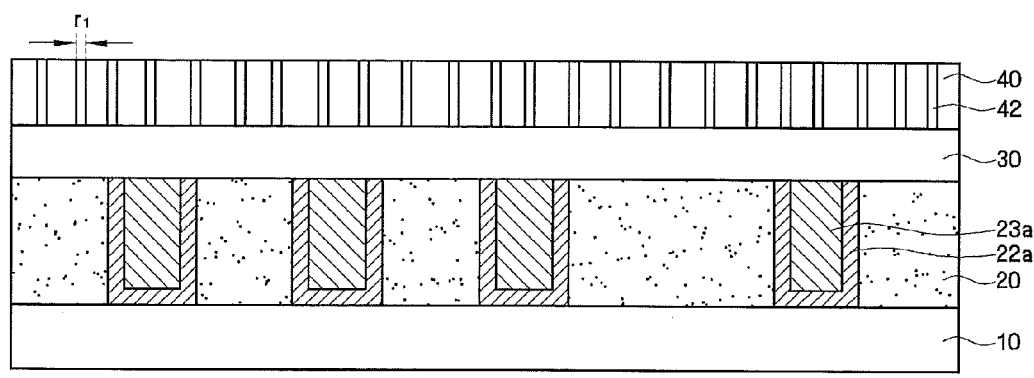

Referring to FIGS. 6 and 7, heat treatment is performed on the second mask layer 40 at a temperature higher than about 400° C. so that the plurality of micropores 41 coalesce into a plurality of first microholes 42. In this case, the heat treatment is the process of supplying energy (E) to the second mask layer 40.

The heat treatment may be a typical heat process or ultraviolet (UV) or electron beam (EB) curing. If the second mask layer 40 receives energy (E) after being subjected to the heat treatment, the plurality of micropores 41 in the second mask layer 40 coalesce with each other to reach thermodynamic stability. In this case, the plurality of micropores 41 continuously coalesce with each other to form elongated tubes.

The length of a tube may vary depending on the dielectric constant of a material of the second mask layer 40. For example, if the material of the second mask layer 40 has a dielectric constant of about 2.2, the plurality of micropores 41 coalesce to form tubes with a length of about 15 nm to 90 nm. If the material has a dielectric constant of about 2.4, the micropores 41 merge to form tubes with a length of about 5 nm to 10 nm.

A plurality of tubes formed during the heat treatment may also be associated with each other. For example, if the micropores 41 merge to form tubes with a length in the range of 5 nm to 10 nm, the tubes thus formed may coalesce with each other to form tubes with a length above the range. Each of the first microholes 42 is a tube having one end opening toward a top surface of the second mask layer 40 and the other end opening toward a bottom surface thereof.

A cross-section of the first microhole 42 has an average diameter r1 of about 1 nm to 10 nm, which may be too fine to obtain using a typical lithography process. Further, each of the second microholes (32 in FIG. 9) that will be formed using the first microholes 42 in a subsequent step may also have a cross-sectional diameter that is too small to obtain using a typical lithography process.

Figure 8:
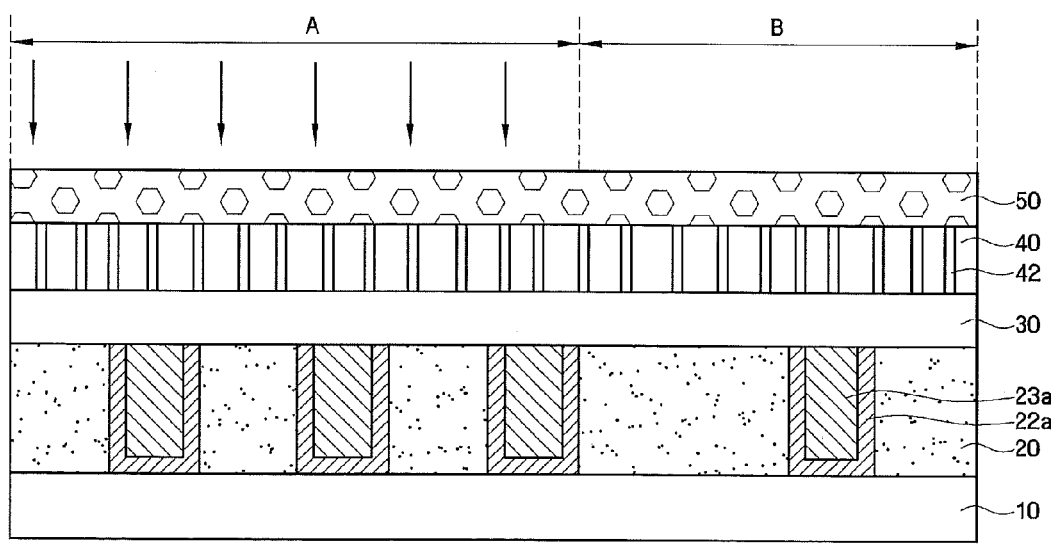
Figure 9:
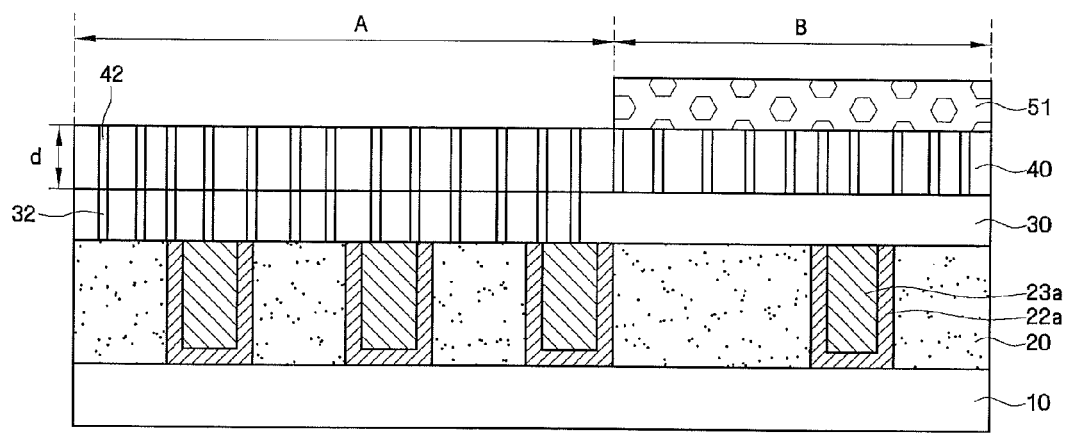

Thereafter, referring to FIGS. 8 and 9, a photoresist layer 50 is applied over the second mask layer 40 having the plurality of first microholes 42 formed thereon. The photoresist layer 50 may be formed of positive or negative photoresist. FIG. 8 shows an example in which the photoresist layer 50 is formed of positive photoresist.

Region 'A' and region 'B' illustrated in FIG. 8 respectively denote a portion in which air-gaps have been formed in the interconnect structure and a portion in which air-gaps have not been formed therein. The photoresist layer 50 in the region A' is removed to expose the first microholes 42 located in region A. In this case, exposure is performed on the photoresist layer in the region A because the photoresist layer 50 is formed of positive photoresist.

After being subjected to subsequent development, the photoresist in region A' is removed while the photoresist in region B is used to form a residual photoresist pattern 51.

Only the first microholes 42 located in region A are exposed by the photoresist pattern 51. That is, only some of the plurality of microholes 42 on the second mask layer 40 are selectively exposed.

Using the first microholes 42 and the second mask layer 40 in region A selectively exposed as an etch mask, the second microholes 32 are formed in a portion of the first mask layer 30 corresponding to region A in which the air-gaps 25 will be formed. That is, the plurality of second microholes 32 is selectively formed in the first mask layer 30.

In this case, the second microholes 32 may be formed by dry etching. If the second microholes 32 are formed by wet etching, then an undercut may occur so that their cross-section diameters may become unnecessarily large. Such an increase in the cross-section diameter of the second microhole 32 may result in formation of unnecessary air-gaps in a subsequent step. That is, distal ends of some of the microholes 32 close to the region B may be formed within the region B, thereby causing an etching solution to flow into the region B during formation of air-gaps. This may also result in etching of the insulating material and thus formation of unnecessary air-gaps in the region B.

Similar to the first microholes 42, each of the second microholes 32 has a cross-section with an average diameter (r2 in FIG. 10) of about 1 nm to about 10 nm, thereby permitting formation of a fine pattern that may be difficult to obtain using a conventional lithography process. Further, in a subsequent step, fine air-gaps 25 can be formed by using the second microholes 32. If the average diameter r2 is less than about 1 nm during the formation of the air-gaps 25, the etching solution may not easily penetrate into the insulating material of the interconnect structure via the second microholes 32, thereby increasing processing time. If the average diameter r2 is greater than about 10 nm, then unnecessary air-gaps 25 may be formed in a portion of the interconnect structure (the region B) in which formation of the air-gaps 25 is not needed.

Meanwhile, considering that the second mask layer 40 may be partially etchable and acts as a mask for the etching, it may be formed to a thickness d above about 500 Å.

Figure 10:
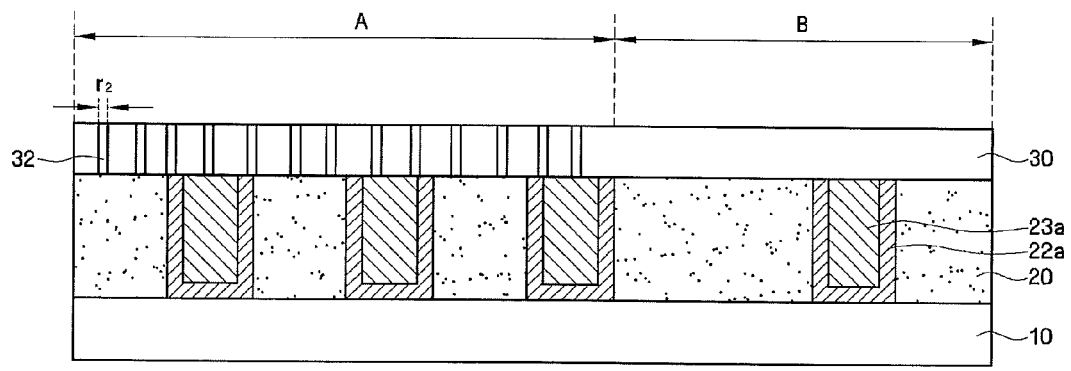

Referring to FIG. 10, the second mask layer 40 is then removed by ashing. The ashing can reduce or minimize damage to the first mask layer 30 and the interconnect structure underlying the second mask layer 40.

Figure 11:
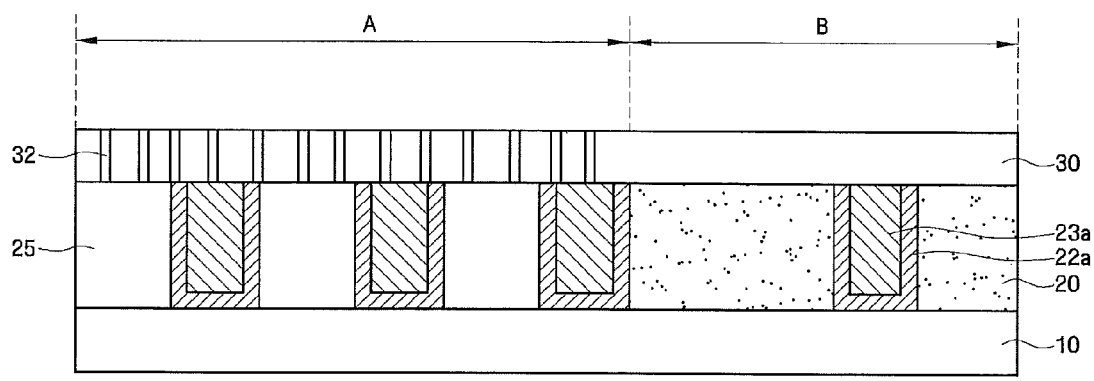

Referring to FIG. 11, using the first mask layer 30 with the plurality of second microholes 32, the insulating material of the interconnect structure is removed to form the air-gaps 25 in the region A. The air-gaps 25 may be formed by typical wet or dry etching. To completely remove the residual insulating material remaining after etching, cleaning may be additionally performed if necessary.

FIGS. 12 through 17 are cross-sectional views illustrating a process sequence of a method of fabricating a semiconductor device according to a modified embodiment of the present inventive subject matter. For sake of clarity and ease of explanation, components each having the same function in all the drawings for describing the previous embodiment are respectively identified by the same reference numerals and their repetitive description will be omitted.

Figure 12:
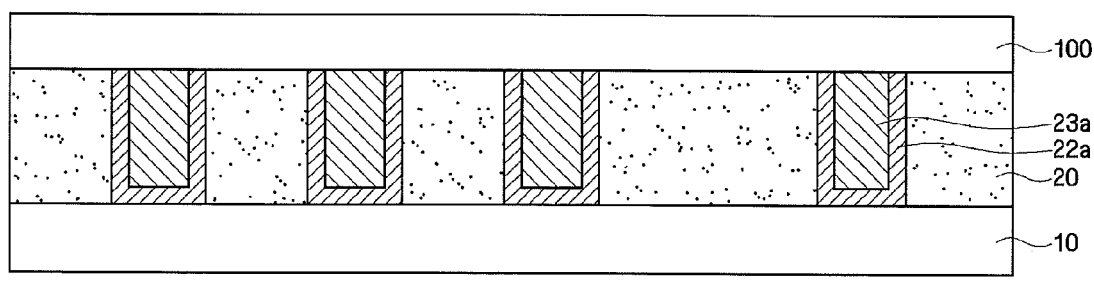
FIGS. 12 through 17 are cross-sectional views illustrating a process sequence of a method of fabricating a semiconductor device according to a modified embodiment of the present inventive subject matter.

First, referring to FIG. 12, a third mask layer 100 is formed on an interconnect structure. Because the third mask layer 100 serves as a hard mask for forming an air-gap in a subsequent step, it is formed of a material having an etch selectivity different from that of an insulating material of the interconnect structure. Here, the third mask layer 100 may be formed of SiN, SiC, SiON, SiCN, and/or a stacked layer thereof. Meanwhile, the third mask layer 100 may be formed by CVD, but aspects of the present inventive subject matter are not limited thereto.

Figure 13:
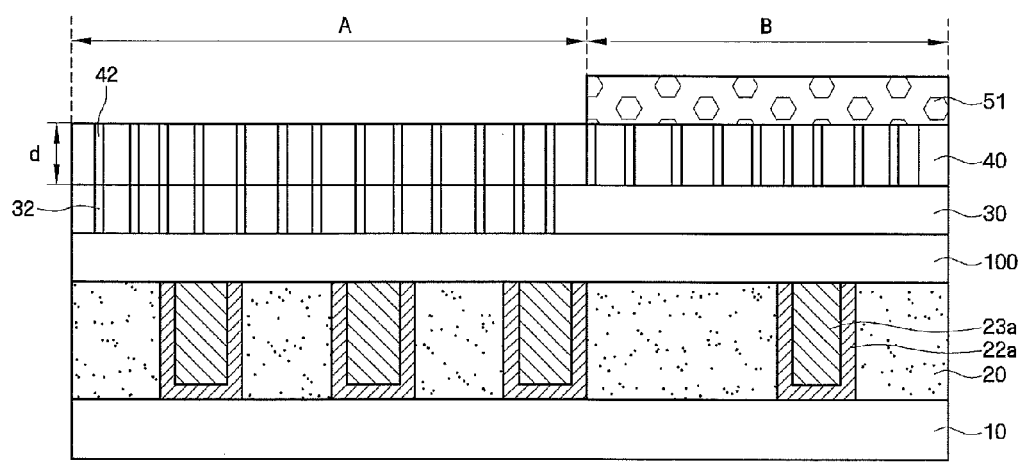

Referring to FIG. 13, the first mask layer 30 and the second mask layer 40 with a plurality of micropores are sequentially formed over the third mask layer 100, followed by heat treatment of the second mask layer 40 to form a plurality of first microholes 42. A photoresist pattern 51 is subsequently formed to expose the first microholes 42 located in the region A in which the air-gaps 25 will be formed. Thereafter, dry etching is performed using the second mask layer 40 having the first microholes 42 as an etch mask to selectively form a plurality of second microholes 32 in a portion of the first mask layer 30 corresponding to the region A. Following the dry etching, the second mask layer 40 is removed by ashing. The above process is carried out in substantially the same manner as the process illustrated in FIGS. 1 through 11.

Figure 14:
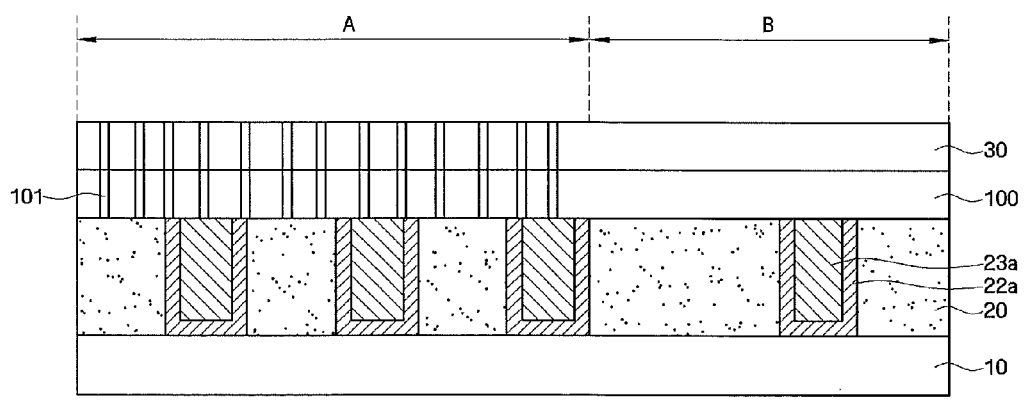

Referring to FIG. 14, using the first mask layer 30 with the second microholes 32, a plurality of third microholes 101 are formed at positions in the third mask layer 100 corresponding to the second microholes 32. That is, the third mask layer 100 has the plurality of third microholes 101 formed in a portion thereof corresponding to the region A in which the air-gaps 25 will be formed.

The third microholes 101 may be formed by dry etching. Each of the third microholes 101 has a cross-section with an average diameter (r3 in FIG. 15) of about 1 nm to 10 nm for substantially the same reason as described above with respect to the second microholes 32. Thus, a detailed explanation thereof will be omitted to avoid repetition.

Figure 15:
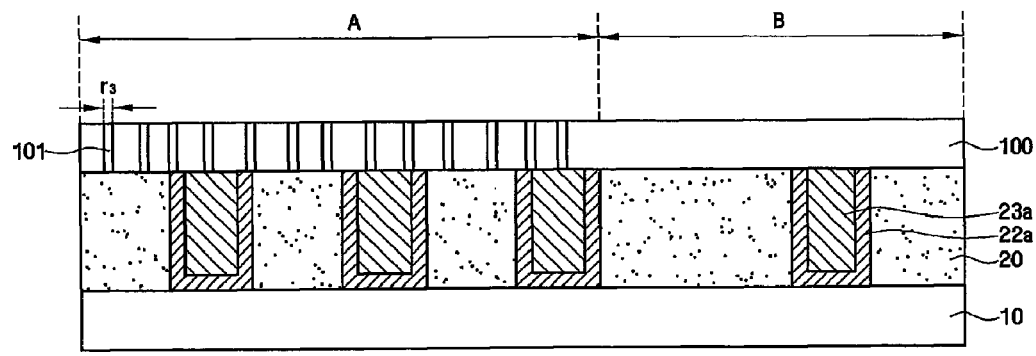

Referring to FIG. 15, the first mask layer 30 is then removed by ashing for substantially the same reasons as described above with respect to the second mask layer 40. Thus, a detailed explanation thereof will be omitted to avoid repetition.

Figure 16:
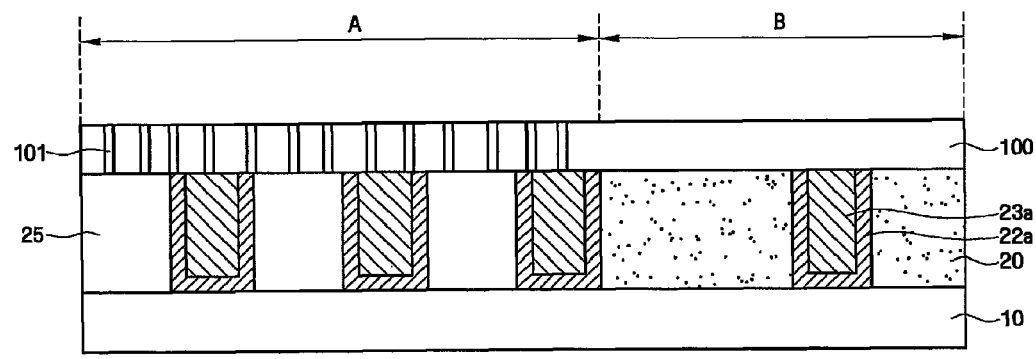

Referring to FIG. 16, the insulating material of the interconnect structure is removed using the third mask layer 100 having the plurality of third microholes 101 to form the air-gaps 25 in the region A. The air-gaps 25 may be formed by typical wet or dry etching. To completely remove the residual insulating material remaining after etching, cleaning may be additionally performed if necessary.

Figure 17:
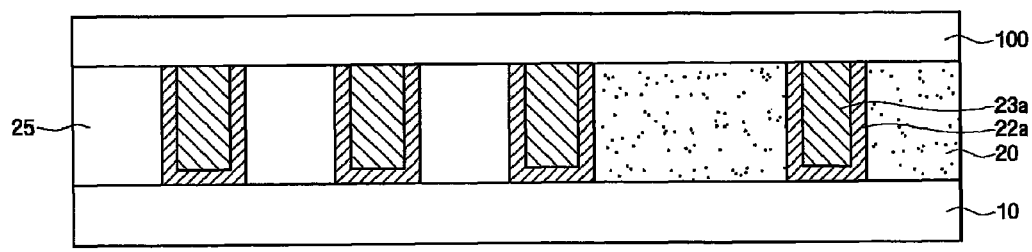

Referring to FIG. 17, the third microholes 101 in the third mask layer 100 are filled up with the same material as that of the third mask layer 100. The third microholes 101 may be filled by CVD or other suitable techniques. After filling the third microholes 101, if necessary, chemical mechanical polishing (CMP) may be performed to planarize a portion of the third mask layer 100 filled with the filling material.

Once the filling of the third microholes 101 is completed, the third mask layer 100 may function as an ILD within a semiconductor device.

According to the present embodiment and its modified example, it is possible to form air-gaps only at a portion in which the air-gaps need to be formed. Another advantage of the present inventive subject matter is that the shape of an air-gap can be adjusted by controlling a diameter of a microhole, or other dimensions. Still another advantage is that air-gaps can be formed using a conventional material used in semiconductor device fabrication as a hard mask, thereby eliminating the need for a new separate material.

While the present inventive subject matter has been particularly shown and described with reference to exemplary embodiments thereof, it will be understood by those of ordinary skill in the art that various changes in form and details may be made therein without departing from the spirit and scope of the present inventive subject matter as defined by the following claims. It is therefore desired that the present embodiments be considered in all respects as illustrative and not restrictive, reference being made to the appended claims rather than the foregoing description to indicate the scope of the invention.

That which is claimed:

1. A method of fabricating a semiconductor device, comprising:
   forming an interconnect structure including first and second interconnects and an insulating material between the first and second interconnects;
   forming a first mask layer and a second mask layer having a plurality of micropores sequentially on the interconnect structure;
   coalescing the plurality of micropores in the second mask layer with each other and forming a plurality of first microholes in the second mask layer;
   forming a plurality of second microholes in the first mask layer using the plurality of first microholes; and
   removing the insulating material using the first mask layer with the plurality of second microholes as an etch mask so as to form an air-gap between the first and second interconnects.

2. The method of claim 1, wherein the forming of the plurality of second microholes in the first mask layer using the plurality of first microholes comprises forming a photoresist layer on the second mask layer, patterning the photoresist layer to selectively expose the plurality of first microholes, and forming the plurality of second microholes in the first mask layer using the plurality of first microholes selectively exposed.

3. The method of claim 1, further comprising removing the first mask layer by ashing after forming the plurality of second microholes.

4. The method of claim 1, further comprising forming a third mask layer on the interconnect structure and forming a plurality of third microholes in the third mask layer using the second microholes prior to forming of the first mask layer, wherein in the removing of the insulating material using the first mask layer with the plurality of second microholes as an etch mask, the insulating material is removed using the third mask layer with the plurality of third microholes as an etch mask.

5. The method of claim 4, further comprising filling up the plurality of third microholes after forming the air-gap.

6. The method of claim 4, wherein the plurality of second microholes and the plurality of third microholes are formed by dry etching.

7. The method of claim 1, wherein the first mask layer comprises amorphous carbon.

8. The method of claim 1, wherein the second mask layer has a dielectric constant (k) of about 1.8 to 2.5.

9. The method of claim 8, wherein the second mask layer has a porosity of about 25% to 60%.

10. The method of claim 1, wherein each of the plurality of second microholes has a cross-section with an average diameter of about 1 nm to 10 nm.

* * * * *